United States Patent
Ding

(10) Patent No.: US 11,558,017 B2
(45) Date of Patent: Jan. 17, 2023

(54) POWER AMPLIFIER

(71) Applicant: Advanced Semiconductor Engineering, Inc., Kaohsiung (TW)

(72) Inventor: Jaw-Ming Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 195 days.

(21) Appl. No.: 16/575,133

(22) Filed: Sep. 18, 2019

(65) Prior Publication Data

US 2021/0083628 A1    Mar. 18, 2021

(51) Int. Cl.
*H03F 1/30* (2006.01)
*H03F 3/213* (2006.01)
*H03F 1/02* (2006.01)

(52) U.S. Cl.
CPC .......... *H03F 1/302* (2013.01); *H03F 1/0211* (2013.01); *H03F 3/213* (2013.01); *H03F 2200/222* (2013.01); *H03F 2200/387* (2013.01); *H03F 2200/528* (2013.01)

(58) Field of Classification Search
CPC ........ H03F 1/302; H03F 3/213; H03F 1/0211; H03F 2200/528; H03F 2200/387; H03F 2200/222; H03F 2200/447; H03F 2200/451; H03F 2200/18; H03F 3/191; H03F 3/20

USPC ................. 330/256, 296, 302, 289
See application file for complete search history.

(56) References Cited

U.S. PATENT DOCUMENTS

| | | | |
|---|---|---|---|
| 7,573,336 B2 * | 8/2009 | Ishimaru | H03F 1/302 330/288 |
| 2004/0056721 A1 * | 3/2004 | LeSage | H03F 1/0277 330/289 |

* cited by examiner

*Primary Examiner* — Samuel S Outten
*Assistant Examiner* — Khiem D Nguyen
(74) *Attorney, Agent, or Firm* — Foley & Lardner LLP

(57) ABSTRACT

A power amplifier circuit includes a current generator and a current mirror driver. The current generator has a first input connected to a first voltage supply and an output configured to generate a first current. The current generator includes a first transistor, a second transistor, a first resistor and a second resistor. The first transistor has an emitter connected to ground. The second transistor has a base connected to a base of the first transistor and an emitter connected to ground. The first resistor is connected between the first voltage supply and a collector of the first transistor. The second resistor is connected between the first voltage supply and a collector of the second transistor. The current mirror drive has a first input connected to the output of the current generator to receive the first current and an output configured to generate a second current.

18 Claims, 14 Drawing Sheets

POWER AMPLIFIER

BACKGROUND

1. Technical Field

The present disclosure relates to a power amplifier, and more particularly, to a bias circuit for a power amplifier.

2. Description of the Related Art

A power amplifier is a circuit in a wireless transceiver for amplifying a signal to be transmitted. As the complexity of the circuit in the wireless transceiver increases, the power amplifier should have more function and better performance. However, because a bias voltage or current for the power amplifier may vary as the operating temperature or the voltage supply changes, which would adversely affect the performance of the power amplifier.

SUMMARY

In accordance with an aspect of the present disclosure, a power amplifier circuit includes a current generator and a current mirror driver. The current generator has a first input connected to a first voltage supply and an output configured to generate a first current. The current generator includes a first transistor, a second transistor, a first resistor and a second resistor. The first transistor has an emitter connected to ground. The second transistor has a base connected to a base of the first transistor and an emitter connected to ground. The first resistor is connected between the first voltage supply and a collector of the first transistor. The second resistor is connected between the first voltage supply and a collector of the second transistor. The current mirror drive has a first input connected to the output of the current generator to receive the first current and an output configured to generate a second current.

In accordance another aspect of the present disclosure, a power amplifier circuit includes a current generator and a bandgap circuit. The current generator has a first input connected to a first voltage supply and an output configured to generate a first current. The bandgap circuit has a first input connected to the output of the current generator to receive the first current and an output configured to generate a reference voltage.

Figure 1A:
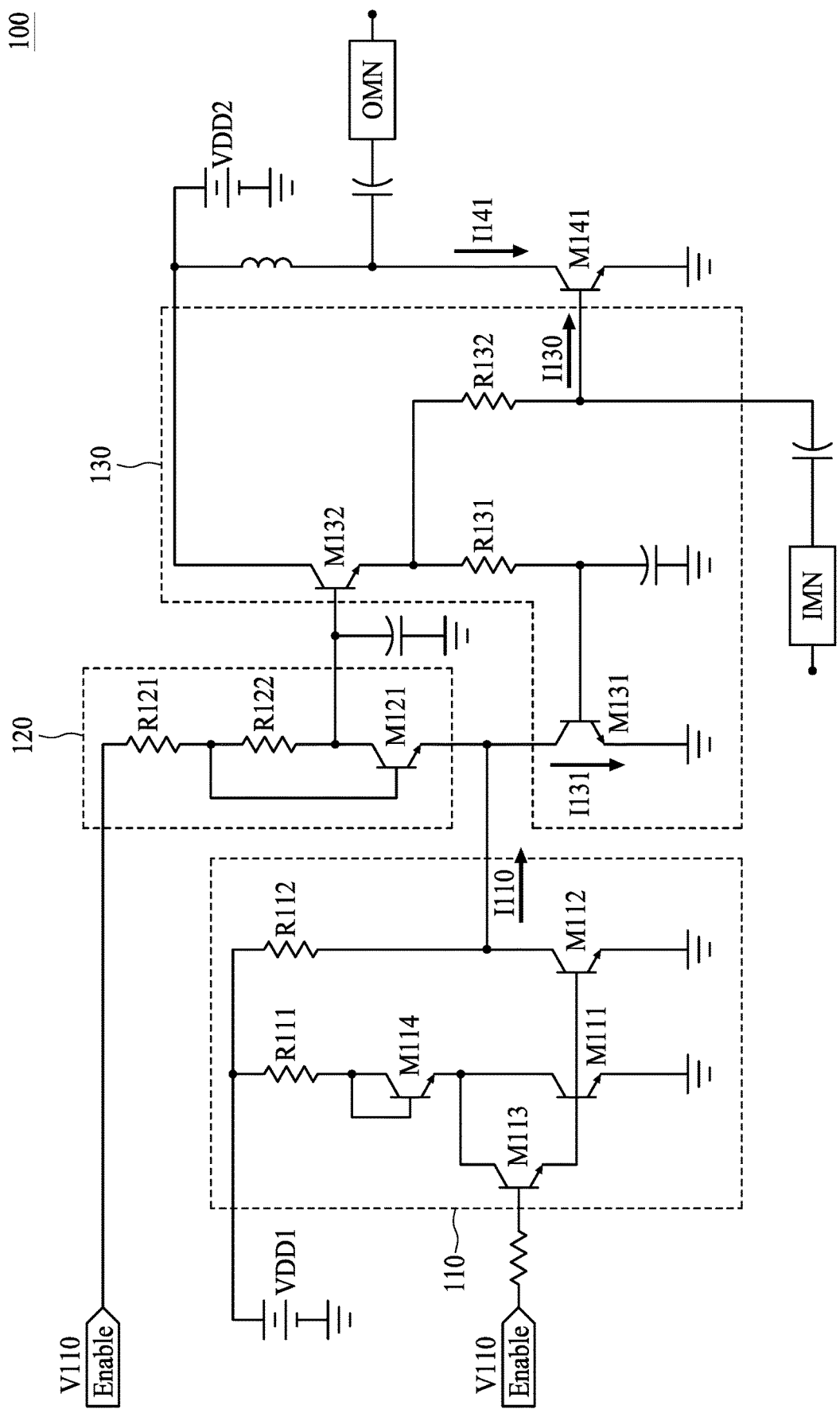
FIG. 1A is a schematic diagram illustrating a power amplifier in accordance with some embodiments of the present disclosure.

Common reference numerals are used throughout the drawings and the detailed description to indicate the same or similar components. The present disclosure can be readily understood from the following detailed description taken in conjunction with the accompanying drawings.

DETAILED DESCRIPTION

Although described with particular reference to a portable transceiver, the circuit and method for biasing a gallium arsenide (GaAs) power amplifier (also referred to as the GaAs bias circuit) can be implemented in any GaAs device in which it is desirable to provide a bias current and voltage. Furthermore, the circuitry described below can be fabricated using an integrated bipolar-field effect transistor (BIFET) process utilizing a lower turn-on voltage of field effect transistors. Furthermore, in particular embodiments, the transistors described below include bipolar junction transistors (referred to as a BJT), which includes heterojunction bipolar junction transistors (referred to as an HBT) and field effect transistors (referred to as a FET) or pseudomorphic high-electron mobility transistors (referred to as a pHEMT) that are fabricated using what is referred to as the BIFET or BiHEMT process. In some embodiments, the transistors described below can be fabricated using what is referred to as the GaAs, indium phosphide (InP), silicon-germanium (SiGe), gallium nitride (GaN), complementary metal-oxide-semiconductor (CMOS), silicon on insulator (SOI) or any other suitable processes.

As used herein, reference to a base, emitter, collector, or other component of a transistor or other circuit component being connected to a base, emitter, collector, or other component of another transistor or other circuit component can refer to a direct connection, or to a connection with another circuit component (e.g. a transistor) disposed therebetween.

FIG. 1A is a schematic diagram illustrating a power amplifier 100 in accordance with some embodiments of the present disclosure. The power amplifier 100 includes a current generator 110, a zero-gain transistor switch 120, a current mirror driver 130 and a transistor M141. In some embodiments, all the transistors of the power amplifier 100 are HBTs. Alternatively, the power amplifier 100 may include any other types of transistors.

The current generator 110 includes transistors M111, M112, M113 and M114, and resistors R111 and R112. The emitters of the transistors M111 and M112 are connected to ground. The base of the transistor M111 is connected to the base of the transistor M112. The collector of the transistor M111 is connected to the collector of the transistor M113 and the emitter of the transistor M114. The collector of the transistor M112 is connected to the resistor 112. The emitter of the transistor M113 is connected to the bases of the transistors M111 and M112. The base of the transistor M113 is connected to receive a control voltage (or enable voltage) V110. The collector of the transistor M113 is connected to the emitter of the transistor M114 and the collector of the transistor M111. The base and the collector of the transistor M114 are connected to the resistor R111. The resistor R111 is connected between a voltage supply VDD1 and the transistor M114. The resistor R112 is connected between the voltage supply VDD1 and the transistor M112.

The current generator 110 is configured to receive the control voltage V110 and to generate current I110 if the control voltage V110 exceeds a threshold value (e.g., 3.2V). In some embodiments, the current I110 may be expressed by the following equation:

$$I_{110} = V_{DD1}\left(\frac{R_{112} - R_{111}}{R_{112} \times R_{111}}\right) + V_{be}\left(\frac{2R_{112} - R_{111}}{R_{112} \times R_{111}}\right) \quad \text{Eq. (1)}$$

In the case that the value of the resistor R111 is equal to the value of the resistor R112, the current I110 may be expressed by the following equation, wherein the current I110 is independent to the voltage supply VDD1:

$$I_{110} = \frac{V_{be}}{R_{112}} \quad \text{Eq. (2)}$$

In the case that the value of the resistor R111 is two times greater than the value of the resistor R112, the current I110 may be expressed by the following equation, wherein the current I110 is independent to the operating temperature of the power amplifier 100:

$$I_{110} = \frac{V_{DD1}}{2R_{112}} \quad \text{Eq. (3)}$$

Figure 1C:
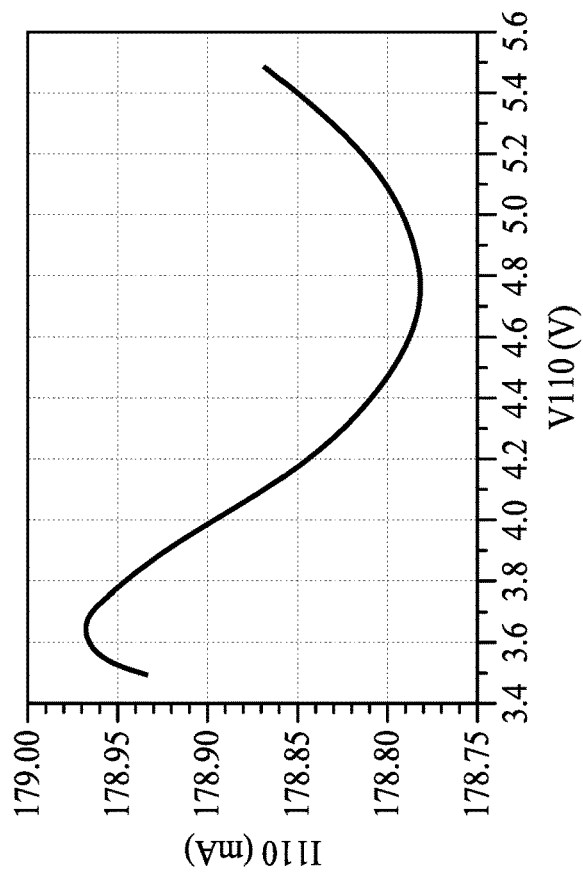
FIG. 1B, FIG. 1C, FIG. 1D, FIG. 1E, FIG. 1F, FIG. 1G and FIG. 1H illustrate simulation results of the power amplifier shown in FIG. 1A in accordance with some embodiments of the present disclosure.
Figure 1B:
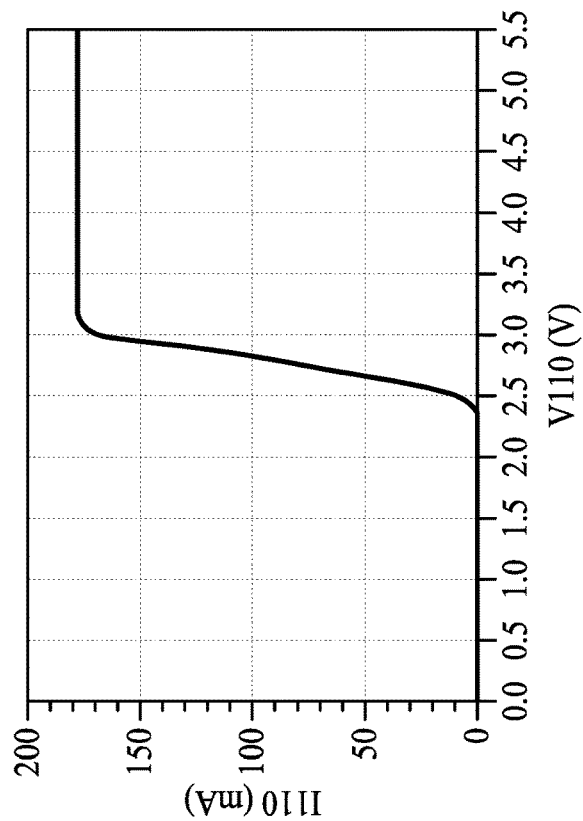
Figure 1D:
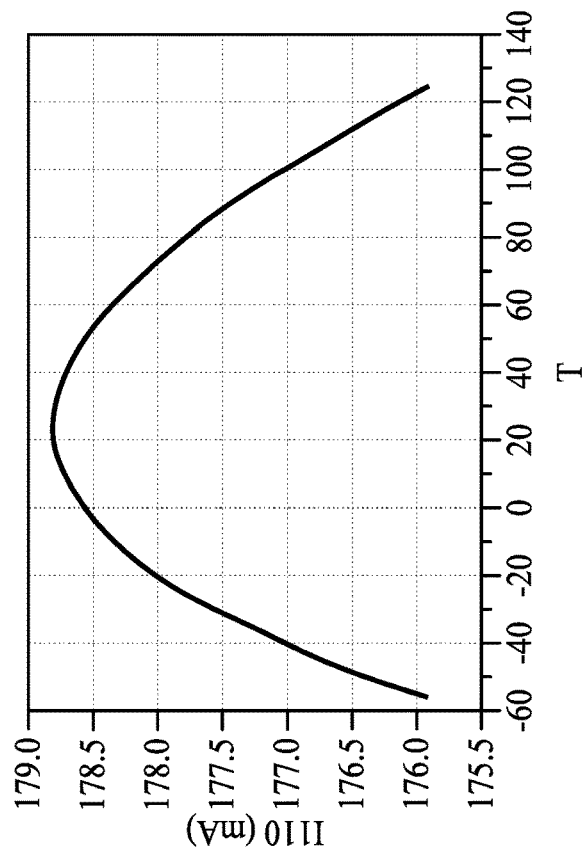
Figure 1E:
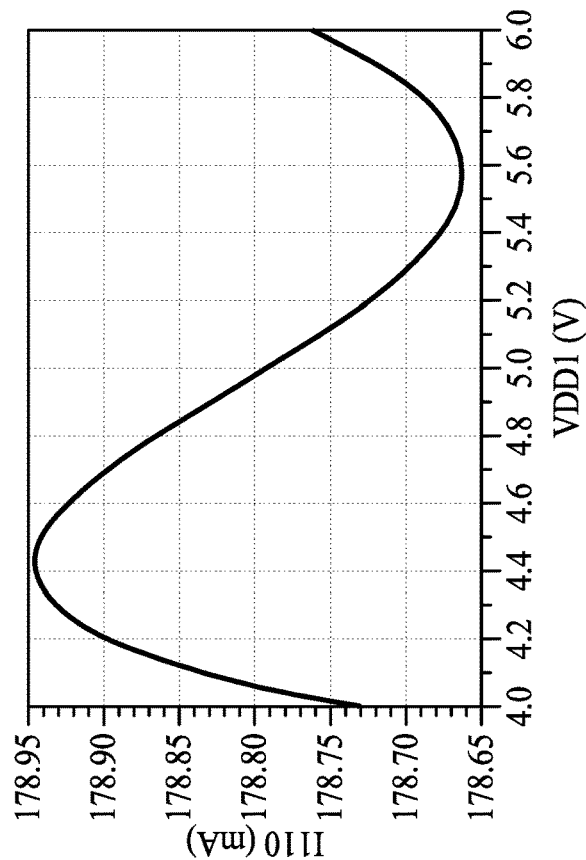
Figure 1F:
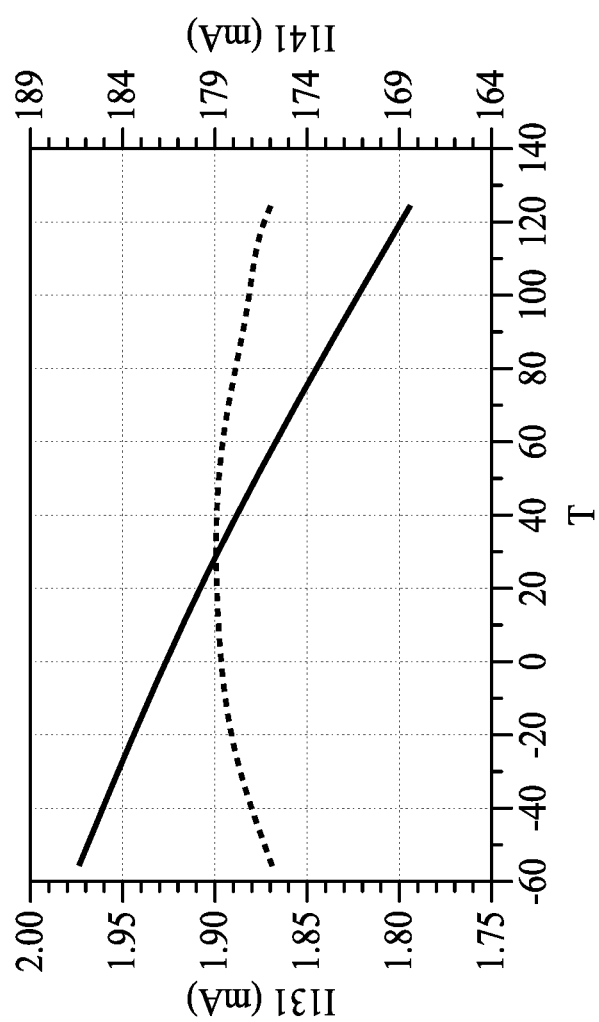
Figure 1H:
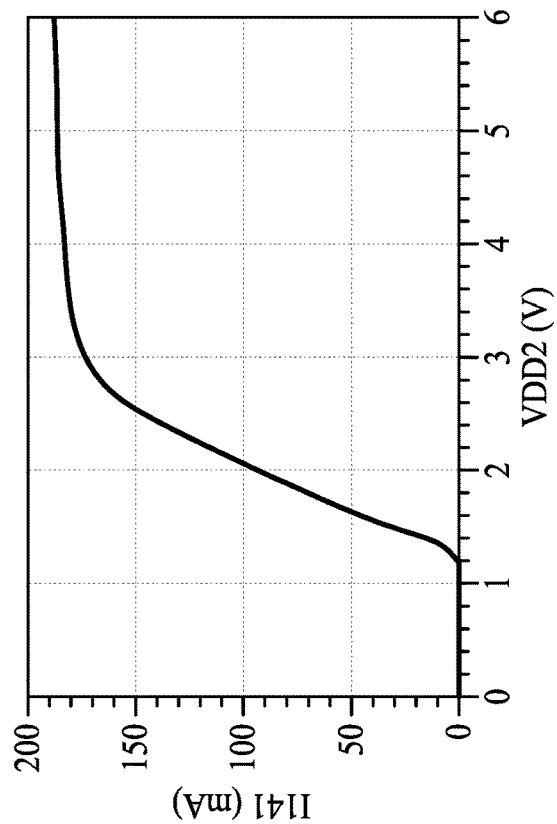
Figure 1G:
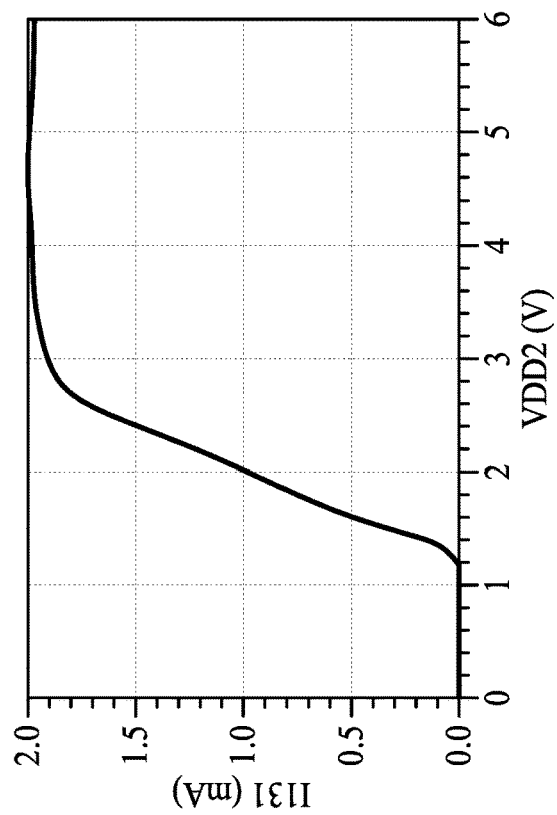

FIG. 1B, FIG. 1C, FIG. 1D, FIG. 1E, FIG. 1F, FIG. 1G and FIG. 1H illustrate simulation results of the power amplifier 100, in accordance with some embodiments of the present disclosure. As shown in FIG. 1B, the x-axis represents the control voltage V110 (V), and the y-axis represents the current I110 (mA). As shown in FIG. 1C, the x-axis represents the control voltage V110 (V), and the y-axis represents the current I110 (mA). As shown in FIG. 1D, the x-axis represents the operating temperature (° C.) of the power amplifier 100, and the y-axis represents the current I110 (mA). As shown in FIG. 1E, the x-axis represents the voltage supply (V), and the y-axis represents the current I110 (mA). As shown in FIG. 1F, the x-axis represents the operating temperature (° C.) of the power amplifier 100, and the y-axis represents the current I131 and I141 (mA). As shown in FIG. 1G, the x-axis represents the voltage supply VDD2 (V), and the y-axis represents the current I131 (mA). As shown in FIG. 1H, the x-axis represents the voltage supply VDD2 (V), and the y-axis represents the current I141 (mA).

In some embodiments, the current generator 110 is configured to generate the substantially constant current I110 (e.g., around 179 mA) once the control voltage V110 exceeds the threshold value. In some embodiments, the threshold value and the value of the current I110 can be changed depending on different specifications.

As shown in FIG. 1B, in the case that the control voltage V110 is less than 2.3V, the current I110 of the current generator 110 is around 0 mA. In other words, no output current is generated when the current generator 110 is turned off. This could reduce the power consumption of the power amplifier 100. In accordance with the embodiments, when the current generator 110 is turned on (e.g., the control voltage V110 exceeds 3.2V), the current I110 is insensitive to the deviation of the control voltage V110. For example, as shown in FIG. 1C, which illustrates a simulation result of the power amplifier 100, the current I110 has a variation less than 0.2% as the control voltage V110 changes from about 3.5V to about 5.5V.

The current generator 110 is also insensitive to the operating temperature of the power amplifier or the deviation of the voltage supply VDD1. For example, as shown in FIG. 1D, the current I110 has a variation less than 1.5% as the operating temperature of the power amplifier 100 varies from about −55° C. to about 125° C. For example, as shown in FIG. 1E, the current I110 has a variation less than 0.2% as the voltage supply VDD1 varies from about 4V to about 6V. In accordance with the embodiments as shown in FIGS. 1A-1E, the current generator 110 can provide a stable current bias (e.g., the current I110), which is insensitive to the operating temperature and the deviation of the voltage supply VDD1, which would improve the performance of the power amplifier 100.

The zero-gain transistor switch 120 includes a transistor M121 and resistors R121 and R122. The emitter of the transistor M121 is connected to the output of the current generator 110 (e.g., connected to the collector of the transistor M112 and the resistor R112). The resistor R122 is connected between the base and the collector of the transistor M121. The resistor R121 is connected between the control voltage V110 and the base of the transistor M121. In some embodiments, the transistor M121 may act as a diode when the control voltage V110 is less than the threshold value. When the control voltage exceeds the threshold value, the transistor M121 and the resistors R121 and R122 act as a zero-gain amplifier, which can maintain the voltage of the base of the transistor M132 of the current mirror driver 130 at a substantially constant voltage, which in turn maintain a substantially constant current at the output stage of the power amplifier 100 (e.g., the current I141 flowing through the transistor M141).

In some embodiments, the zero-gain transistor switch 120 can be omitted or replaced by a diode. However, the current I141 would vary as the control voltage V110 increases. For example, as the control voltage V110 increases from about 3V to about 5.5V, the current I141 may have a deviation about 120 mA. Such deviation of the current I141 would adversely affect the performance of the power amplifier 100. By using the zero-gain transistor switch 120 as shown in FIG. 1A, the current I141 may maintain at a substantially constant value. For example, as the control voltage V110 increases from about 3V to about 5.5V, the current I141 may have a deviation less than about 1 mA.

The current mirror driver 130 includes transistors M131, M132 and resistors R131 and R132. The emitter of the transistor M131 is connected to ground. The base of the transistor M131 is connected to the resistor R131. The collector of the transistor M131 is connected to the output of the current generator (e.g., to the collector of the transistor M112 and the resistor R112) and the zero-gain amplifier switch 120 (e.g., to the emitter of the transistor M121). The emitter of the transistor M132 is connected to the resistors R131 and R132. The base of the transistor M132 is connected to the zero-gain amplifier switch 120 (e.g., to the collector of the transistor M121). The collector of the transistor M132 is connected to a voltage supply VDD2. The resistor R131 is connected between the emitter of the transistor M132 and the base of the transistor M131. The resistor R132 is connected between the emitter of the transistor M132 and the base of the transistor M141. In some embodiments, the transistors R131 and R132 are configured to tune or adjust the temperature curve for the power amplifier 100.

The current mirror driver 130 is configured generate current I130 to the base of transistor M141 to according to the current I131 flowing through the transistor M131. In other words, the output current (e.g., the current I141) is generated according to the current I131. For example, the transistor M131 may act as a current mirror for the transistor M141. In some embodiments, the transistor M131 has a higher current density compared with the transistor M141, and thus the voltage between the base and the emitter (Vbe) of the transistor M131 is higher than that of the transistor M141. The difference between Vbe of the transistor M131 and Vbe of the transistor M141 may make the current I141 independent to the change of the operating temperature of the power amplifier 100 by adjusting the values of the resistors R131 and R132.

As shown in FIG. 1F, the current I131 has a deviation less than about 9% as the operating temperature of the power amplifier 100 varies from about −55° C. to about 125° C., and the current I141 has a deviation less than about 2% as the operating temperature of the power amplifier 100 varies from about −55° C. to about 125° C. As shown in FIG. 1G and FIG. 1H, the current I131 has a deviation less than about 5% as the voltage supply VDD2 varies from about 3.2V to about 6V, and the current I141 has a deviation less than about 5% as the voltage supply VDD2 varies from about 3.2V to about 6V. The stable DC current bias provided to the transistor M141 would improve the performance of the power amplifier 100.

Figure 2:
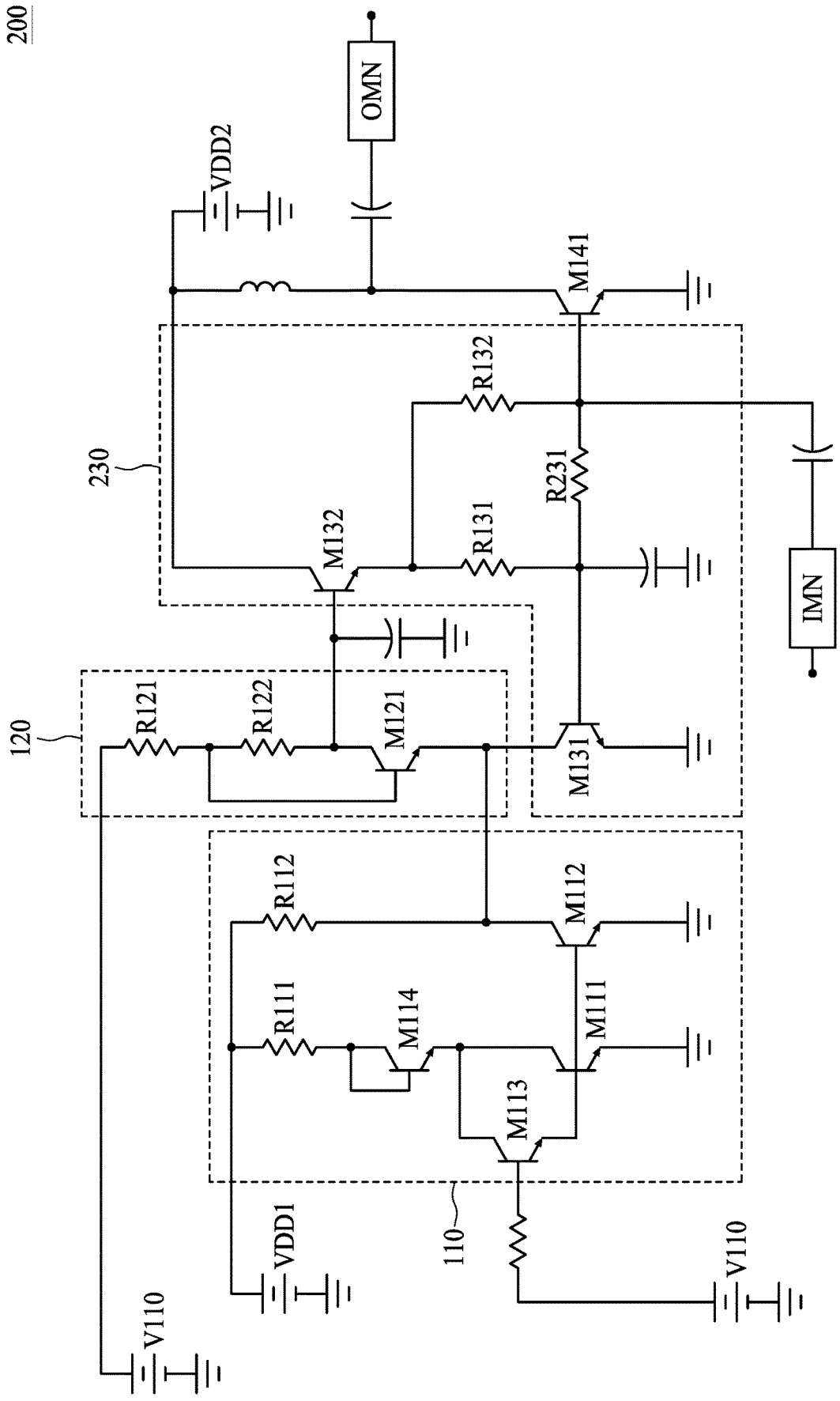
FIG. 2 is a schematic diagram illustrating a power amplifier in accordance with some embodiments of the present disclosure.

FIG. 2 is a schematic diagram illustrating a power amplifier 200 in accordance with some embodiments of the present disclosure. The power amplifier 200 is similar to the power amplifier 100 as shown in FIG. 1A, except that the current mirror driver 230 of the power amplifier 200 further includes a resistor R231 connected between the base of the transistor M131 and the transistor M141. In some embodiments, the resistor R231 may act as a dynamic bias resistor, which can increase 1 dB compression point (P1 dB) of the power amplifier 200 and improve the performance of the power amplifier 200.

Figure 3:
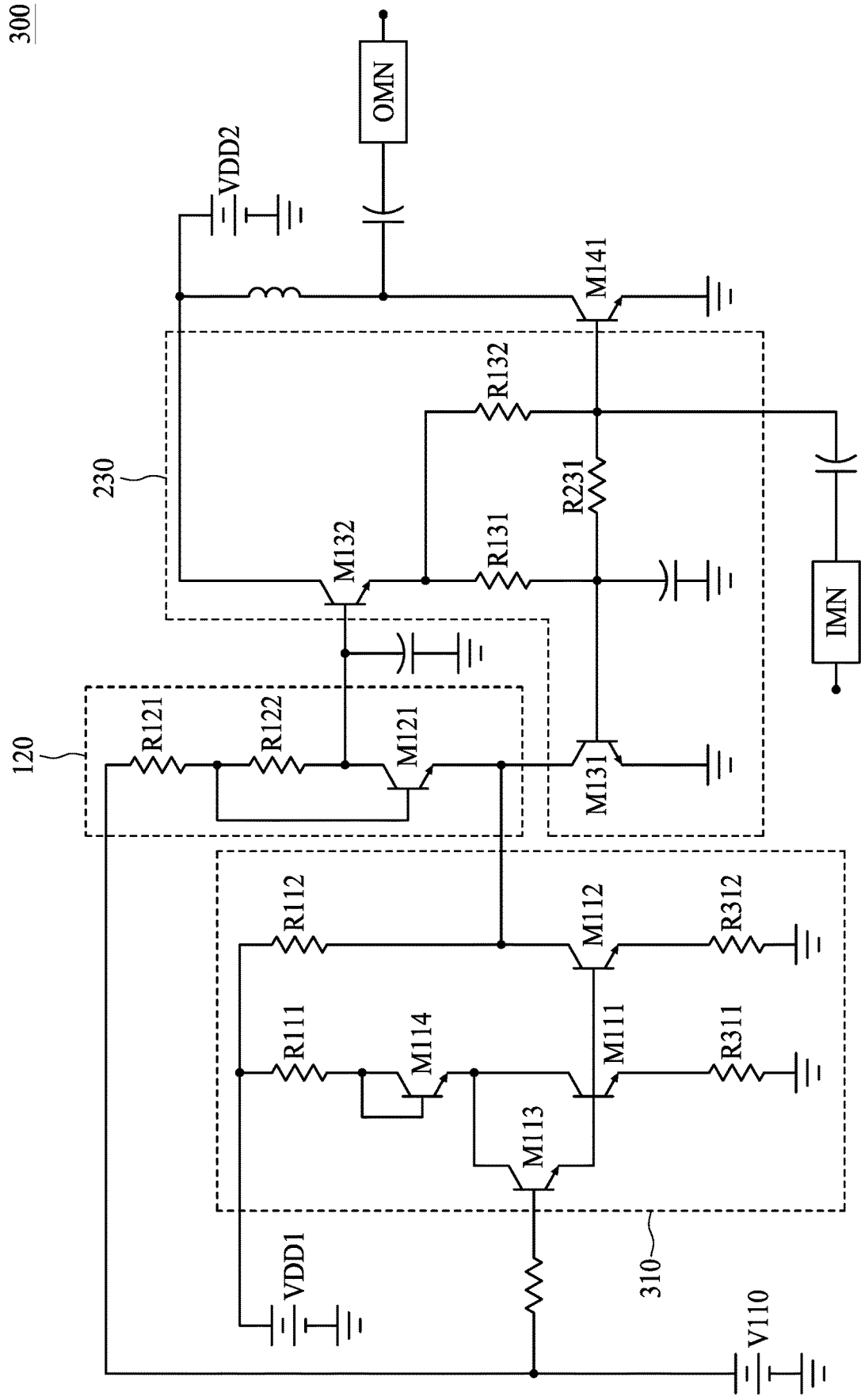
FIG. 3 is a schematic diagram illustrating a power amplifier in accordance with some embodiments of the present disclosure.

FIG. 3 is a schematic diagram illustrating a power amplifier 300 in accordance with some embodiments of the present disclosure. The power amplifier 300 is similar to the power amplifier 200 as shown in FIG. 2, except that the current generator 310 of the power amplifier 300 further includes resistors R311 and R312. The resistor R311 is connected between the emitter of the transistor M111 and ground. The resistor R312 is connected between the emitter of the transistor M112 and ground. The resistors R311 and R312 can reduce the sensitivity of the current generator 310 during the manufacturing process, and increase the accuracy of the relationship between the current flowing through the transistors M111 and M112.

Figure 4:
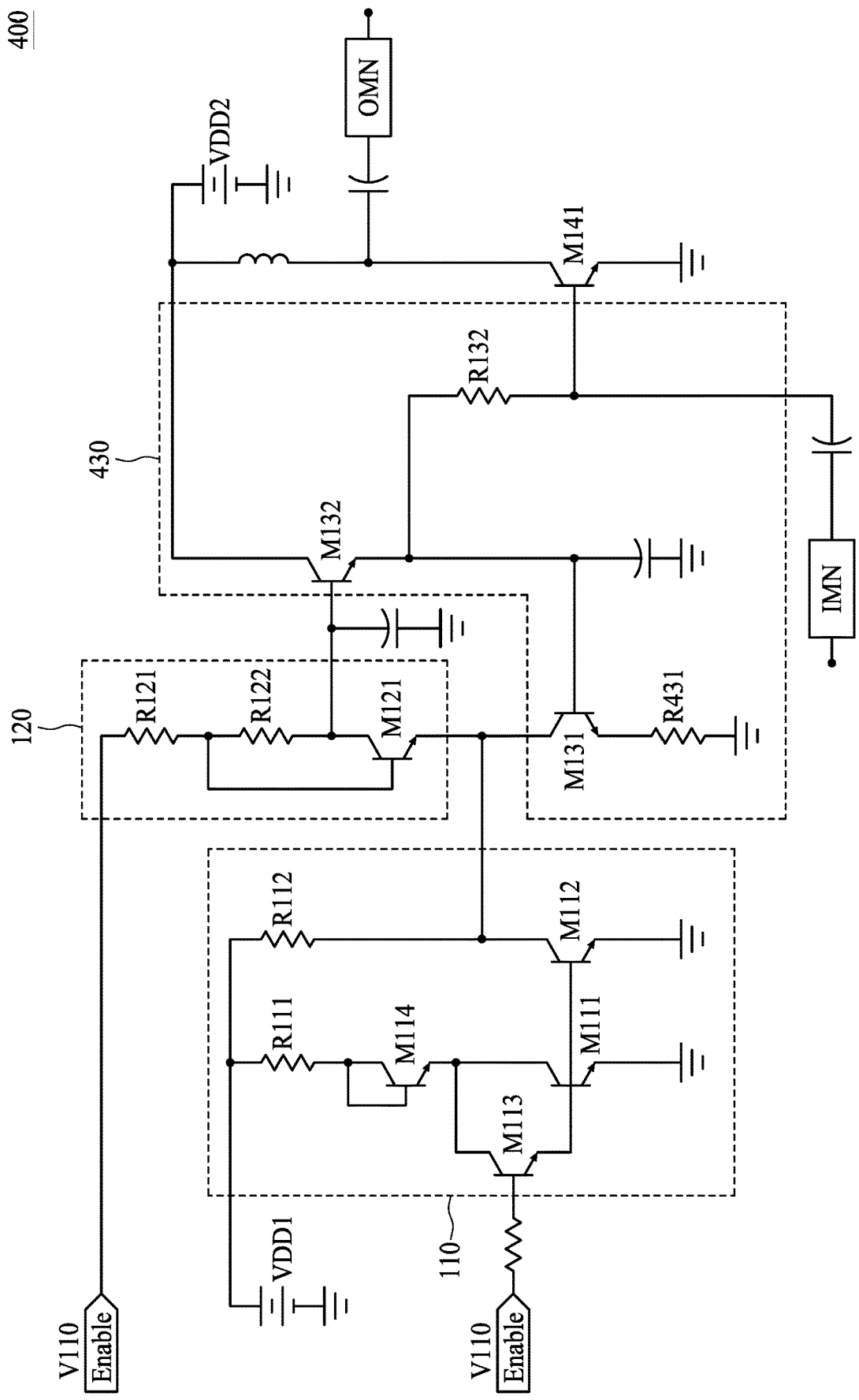
FIG. 4 is a schematic diagram illustrating a power amplifier in accordance with some embodiments of the present disclosure.

FIG. 4 is a schematic diagram illustrating a power amplifier 400 in accordance with some embodiments of the present disclosure. The power amplifier 400 is similar to the power amplifier 100 as shown in FIG. 1A, except that the current mirror driver 430 of the power amplifier 400 further includes a resistor R431 connected between the emitter of the transistor M131 and ground. The resistor R431 can reduce the aspect ratio of the transistor M131 to reduce the size of the power amplifier 400.

Figure 5A:
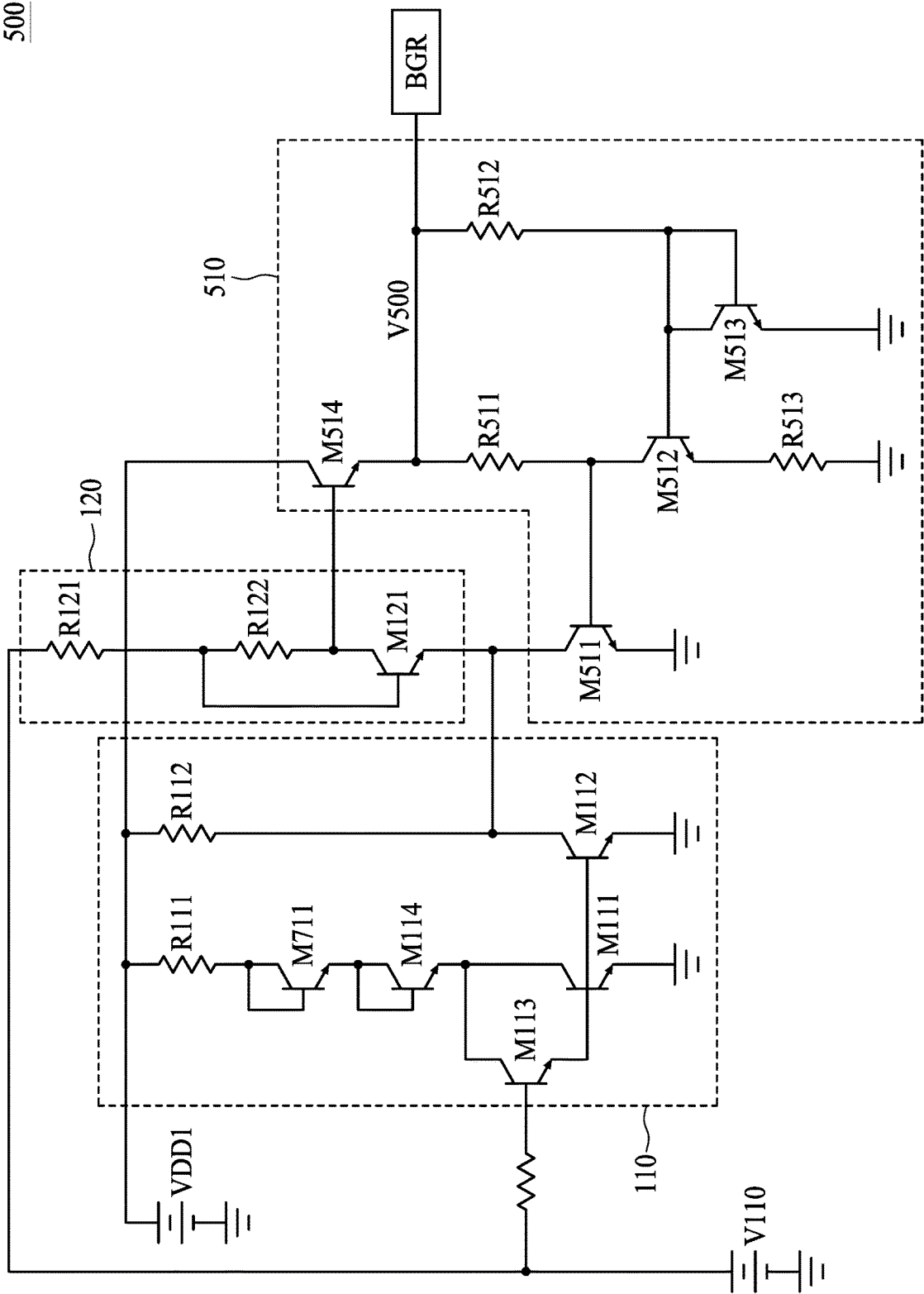
FIG. 5A is a schematic diagram illustrating a bandgap reference circuit in accordance with some embodiments of the present disclosure.

FIG. 5A is a schematic diagram illustrating a bandgap reference circuit 500 in accordance with some embodiments of the present disclosure. The bandgap reference circuit 500 includes a current generator 110, a zero-gain amplifier switch 120 and a bandgap core 510. In some embodiments, the current generator 110 and the zero-gain amplifier switch 120 of the bandgap reference circuit 500 are the same as those of the power amplifier 100 as shown in FIG. 1A, and the descriptions thereof can be applicable herein. In other embodiments, the current generator 110 of the bandgap reference circuit 500 can be replaced by the current generator 310 of the power amplifier 300 as shown in FIG. 3.

The bandgap core 510 includes transistors M511, M512, M513, M514 and resistors, R511, R512 and R513. The emitter of the transistor M511 is connected to ground. The base of the transistor M511 is connected to the collector of the transistor M512. The collector of the transistor of the transistor M511 is connected to the current generator 110 (e.g., to the collector of the transistor M112) and the zero-gain amplifier switch 120 (e.g., to the emitter of the transistor M121). The emitter of the transistor M512 is connected to ground through the resistor R513. The base of the transistor M512 is connected to the collector and the base of the transistor M513. The emitter of the transistor M513 is connected to ground. The emitter of the transistor M514 is connected to the resistors R511 and R512. The base of the transistor M514 is connected to the zero-gain amplifier switch 120 (e.g., to the collector of the transistor M121). The collector of the transistor M514 is connected to the voltage supply VDD1.

Figure 5C:
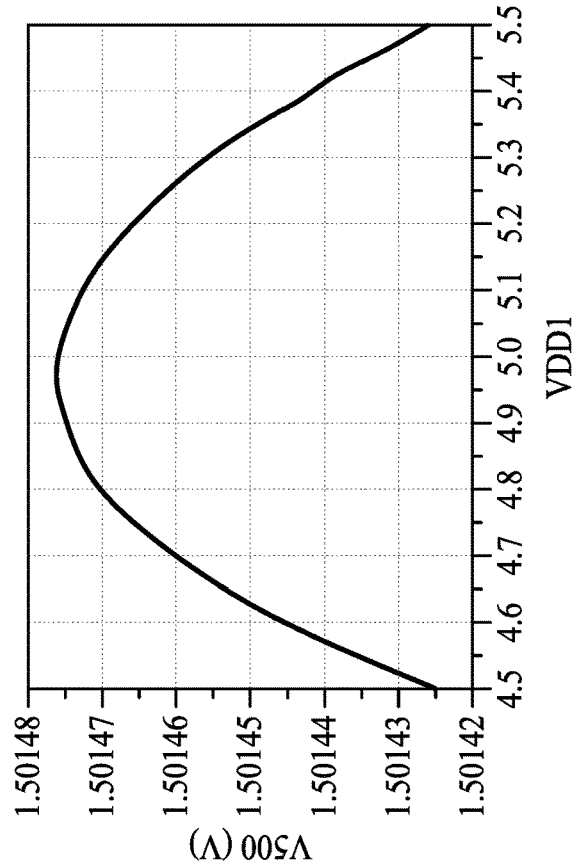
FIG. 5B, FIG. 5C and FIG. 5D illustrate simulation results of the bandgap reference circuit shown in FIG. 5A in accordance with some embodiments of the present disclosure.
Figure 5B:
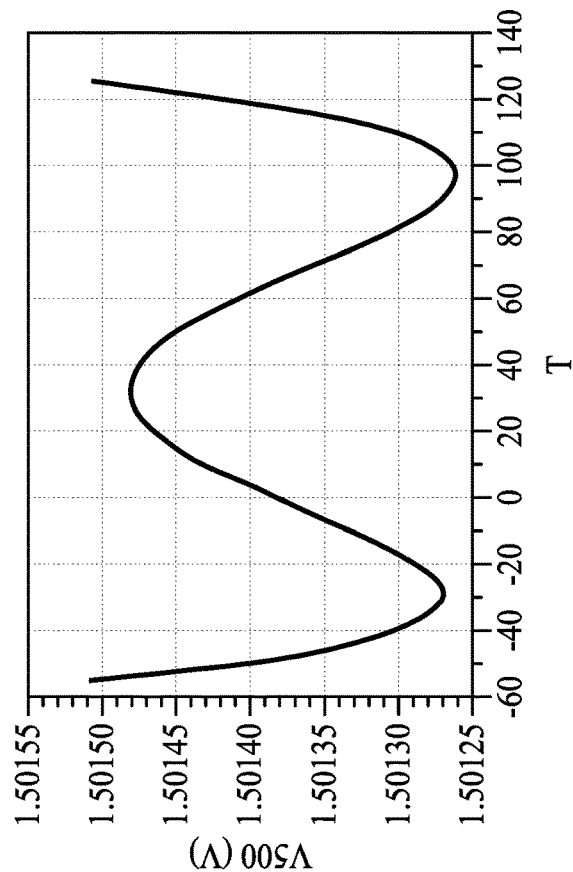
Figure 5D:
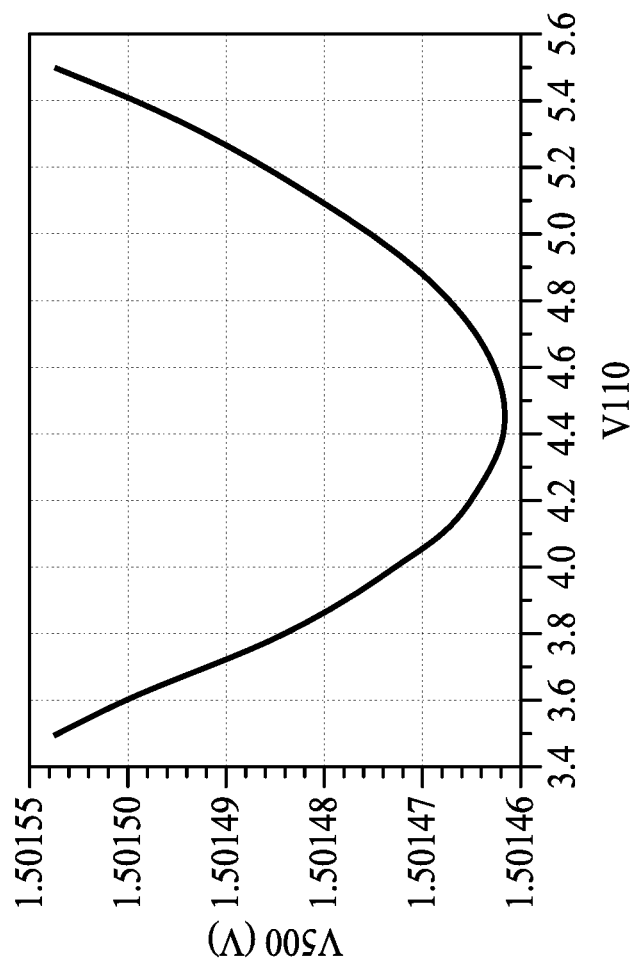

FIG. 5B, FIG. 5C and FIG. 5D illustrate simulation results of the bandgap reference circuit 500, in accordance with some embodiments of the present disclosure. As shown in FIG. 5B, the x-axis represents the operating temperature of the bandgap reference circuit 500 (° C.), and the y-axis represents the voltage V500 (mV) at the output of the bandgap reference circuit 500. As shown in FIG. 5C, the x-axis represents the voltage supply VDD1 (V), and the y-axis represents the voltage V500 (mV) at the output of the bandgap reference circuit 500. As shown in FIG. 5D, the x-axis represents the control voltage V110 (V), and the y-axis represents the voltage V500 (mV) at the output of the bandgap reference circuit 500.

As shown in FIG. 5B, the voltage V500 has a variation less than 0.008% as the operating temperature of the bandgap reference circuit 500 varies from about −55° C. to about 125° C. As shown in FIG. 5C, the voltage V500 has a variation less than 0.002% as the voltage supply VDD1 varies from about 4.5V to about 5.5V. As shown in FIG. 5D, the voltage V500 has a variation less than 0.002% as the current generator 110 varies from about 3.5V to about 5.5V. The bandgap reference circuit 500 can provide a stable reference voltage, which is insensitive to the operating temperature, the voltage supply VDD1 and the control voltage V110. This can increase the power supply rejection ratio (PSRR) of the bandgap reference circuit 500 and improve the performance of the bandgap reference circuit 500.

Figure 6:
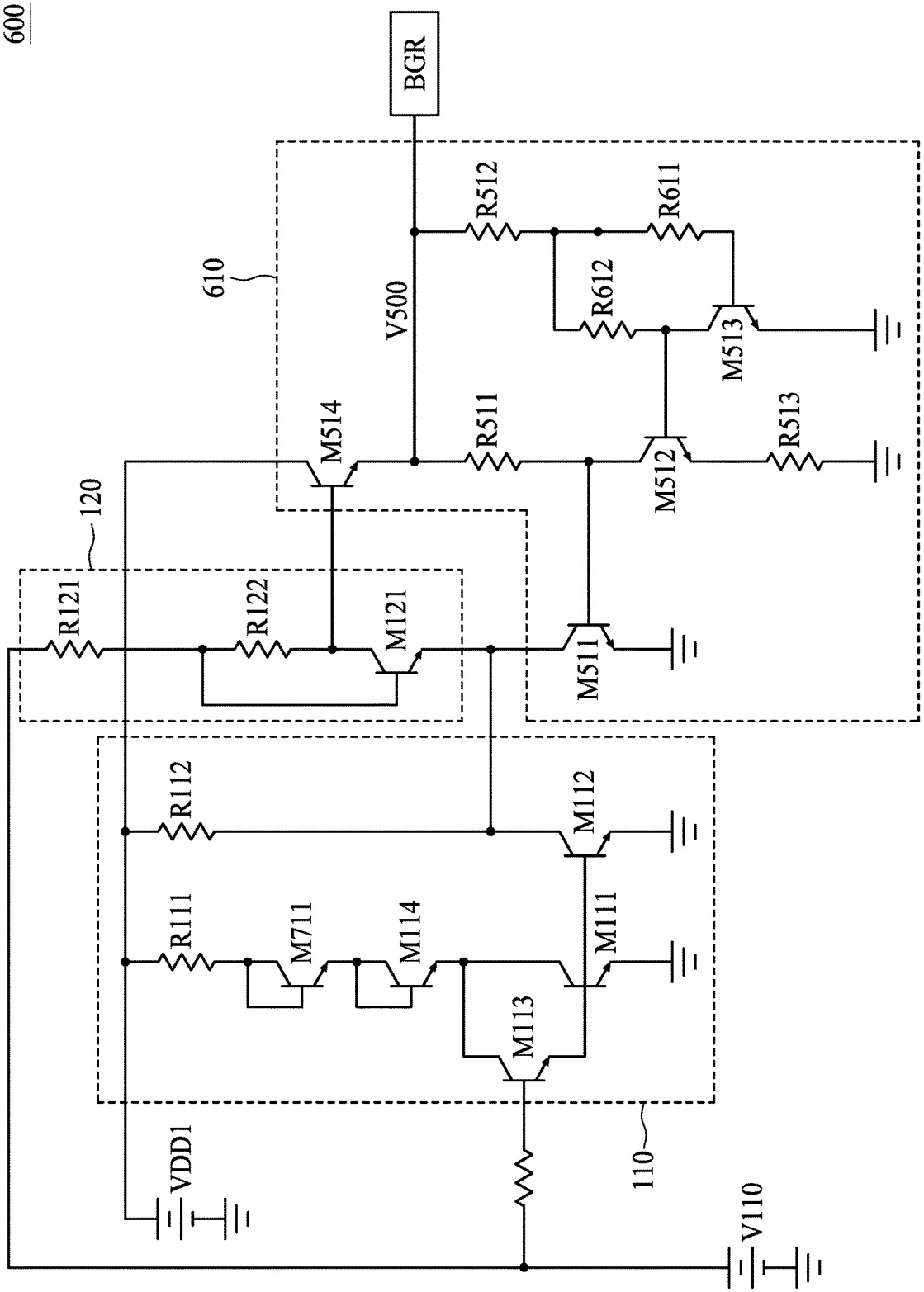
FIG. 6 is a schematic diagram illustrating a bandgap reference circuit in accordance with some embodiments of the present disclosure.

FIG. 6 is a schematic diagram illustrating a bandgap reference circuit 600 in accordance with some embodiments of the present disclosure. The bandgap reference circuit 600 is similar to the bandgap reference circuit 500 as shown in FIG. 5A, except that the bandgap core 610 of the bandgap reference circuit 600 further includes resistors R611 and R612. The resistor R611 is connected between the base of the transistor M513 and the resistor R512. The resistor R612 is connected between the collector of the transistor M513 and the resistor R512.

Figure 7:
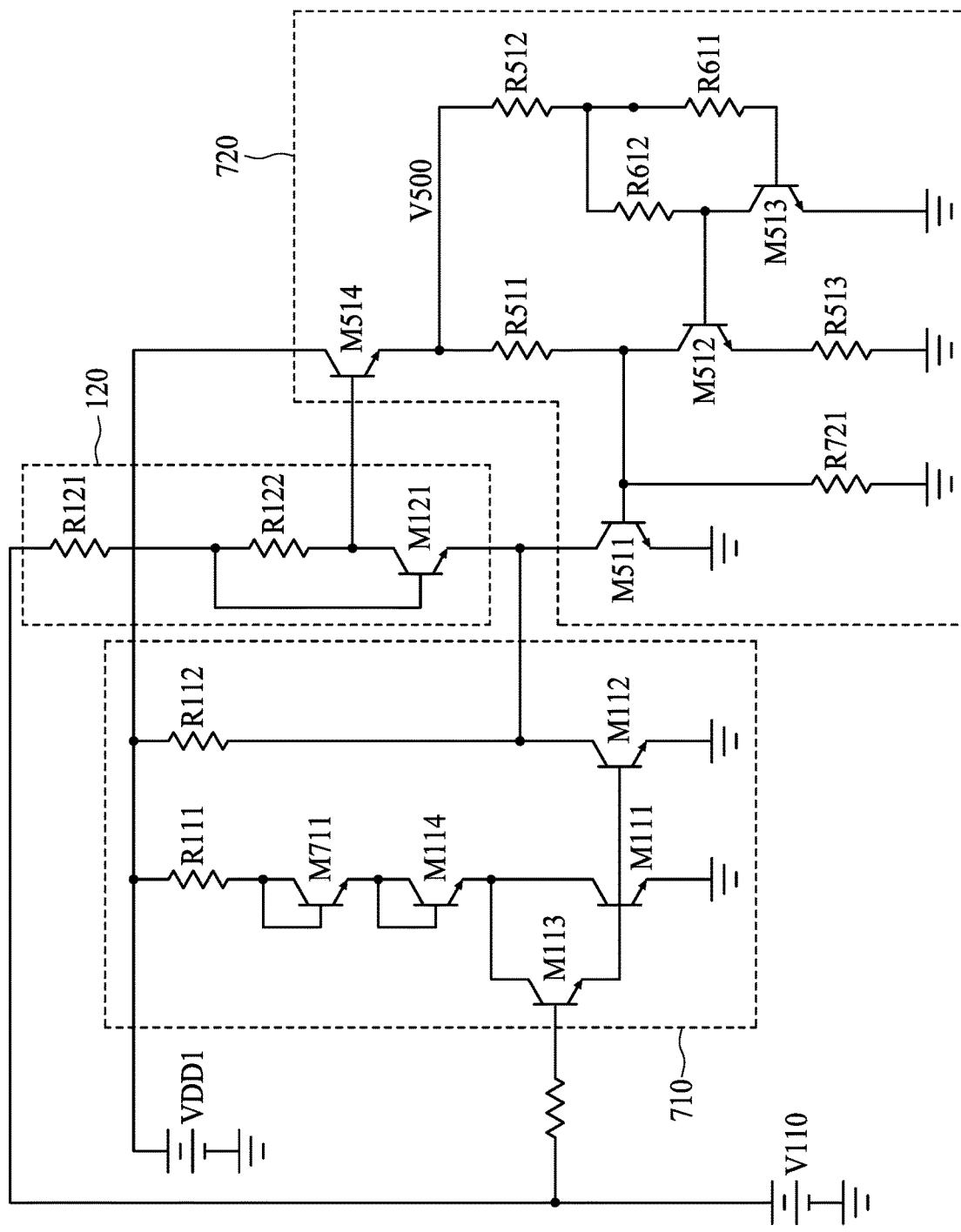
FIG. 7 is a schematic diagram illustrating a bandgap reference circuit in accordance with some embodiments of the present disclosure.

FIG. 7 is a schematic diagram illustrating a bandgap reference circuit 700 in accordance with some embodiments of the present disclosure. The bandgap reference circuit 700 is similar to the bandgap reference circuit 600 as shown in FIG. 6, except that the current generator 710 of the bandgap reference circuit 700 further includes a transistor M711 and that the bandgap core 720 of the bandgap reference circuit 700 further includes a resistor R721. The transistor M711 is connected between the resistor R111 and the collector of the transistor M114. The resistor R721 is connected between the base of the transistor M511 and ground.

Figure 8:
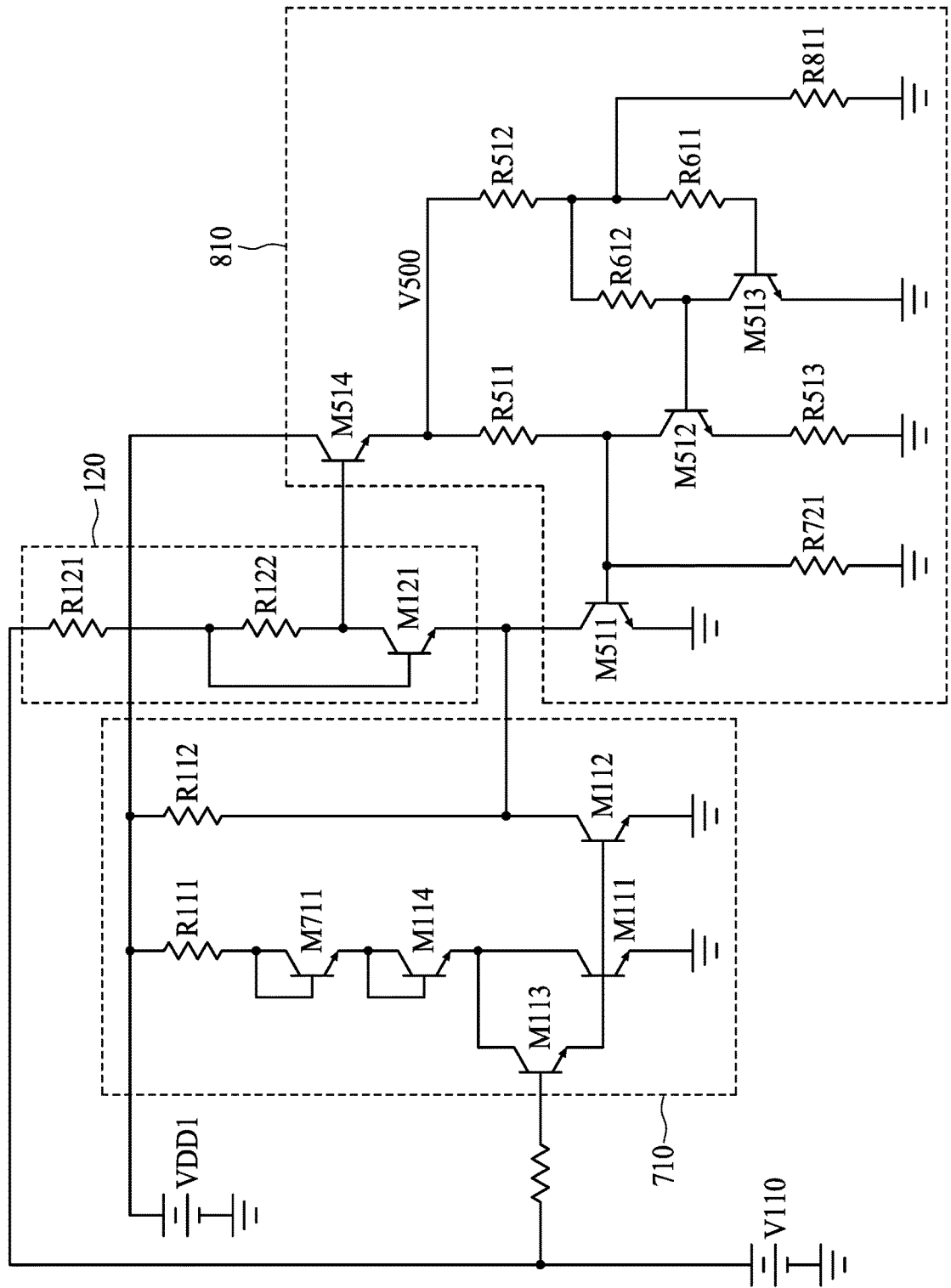
FIG. 8 is a schematic diagram illustrating a bandgap reference circuit in accordance with some embodiments of the present disclosure.

FIG. 8 is a schematic diagram illustrating a bandgap reference circuit 800 in accordance with some embodiments of the present disclosure. The bandgap reference circuit 800 is similar to the bandgap reference circuit 700 as shown in FIG. 7, except that the bandgap reference circuit 810 of the bandgap reference circuit 800 further includes a resistor R811. The resistor R811 is connected between the resistor R512 and ground.

As used herein, the singular terms "a," "an," and "the" may include a plurality of referents unless the context clearly dictates otherwise.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "approximately" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A power amplifier circuit comprising:
   a current generator having a first input connected to a first voltage supply and an output configured to generate a first current, the current generator comprising:
      a first transistor having an emitter connected to ground;
      a second transistor having a base connected to a base of the first transistor and an emitter connected to ground;
      a first resistor connected between the first voltage supply and a collector of the first transistor;
      a second resistor connected between the first voltage supply and a collector of the second transistor;
      a third transistor having a base connected to a second voltage supply, an emitter connected to the base of the first transistor and a collector connected to the collector of the first transistor; and
      a fourth transistor having an emitter connected to the collector of the first transistor, wherein a base of the fourth transistor and a collector of the fourth transistor are connected to the first resistor; and
   a current mirror driver having a first input connected to the output of the current generator to receive the first current and an output configured to generate a second current.

2. The power amplifier circuit of claim 1, wherein the first current has a variation of current less than 0.2% as the first voltage supply has a variation of voltage about 2V.

3. The power amplifier circuit of claim 1, wherein a resistance of the first resistor is substantially the same as a resistance of the second resistor.

4. The power amplifier circuit of claim 1, wherein a ratio of a resistance of the first resistor to a resistance of the second resistor is about 2:1.

5. The power amplifier circuit of claim 1, wherein the current generator further comprises:
   a third resistor connected between the emitter of the first transistor and ground; and
   a fourth resistor connected between the emitter of the second transistor and ground.

6. The power amplifier circuit of claim 1, further comprising:
   a fifth transistor having an emitter connected to the output of the current generator and a collector connected to a second input of the current mirror driver;
   a fifth resistor connected between the collector and a base of the fifth transistor; and
   a sixth resistor connected between the second voltage supply and the base of the fifth transistor.

7. The power amplifier circuit of claim 1, wherein the current mirror driver comprises:

a sixth transistor having an emitter connected to ground and a collector connected to the output of the current generator;

a seventh transistor having a base connected to a second input of the current mirror driver, an emitter connected to a base of the sixth transistor and a collector connected to a third voltage supply;

a seventh resistor connected between the base of the sixth transistor and the emitter of the seventh transistor; and an eighth resistor connected between the emitter of the seventh transistor and the output of the current mirror driver.

8. The power amplifier circuit of claim 7, wherein the current mirror driver further comprises a ninth resistor connected between the base of the sixth transistor of the current mirror driver and the eighth resistor of the current mirror driver.

9. The power amplifier circuit of claim 1, further comprising an eighth transistor having an emitter connected to ground, a base connected to the output of the current mirror driver and configured to receive the second current, and a collector connected to an output match element (OMN).

10. The power amplifier circuit of claim 1, wherein the output of the current mirror driver is connected to an input matching element (IMN).

11. The power amplifier circuit of claim 1, wherein the first current has a variation of current less than 1.5% as an operating temperature of the power amplifier varies from about −55° C. to about 125° C.

12. The power amplifier circuit of claim 1, wherein the current generator and the current mirror driver solely include one kind of transistors, and wherein the transistors are heterojunction bipolar transistors (HBT).

13. The power amplifier circuit of claim 9, wherein the eighth transistor is configured to generate a third current based on the second current, wherein the third current is independent to the change of an operating temperature of the power amplifier circuit.

14. A power amplifier circuit comprising:

a current generator having a first input connected to a first voltage supply and an output configured to generate a first current, wherein the first current has a variation of current less than 1.5% as an operating temperature of the power amplifier circuit varies from about −55° C. to about 125° C.; and the first current has a variation of current less than 0.2% as the first voltage supply has a variation of voltage about 2V;

a current mirror driver having a first input connected to the output of the current generator to receive the first current and an output configured to generate a second current; and a zero-gain switch configured to maintain a voltage of a second input of the current mirror driver at a substantially constant voltage, wherein the zero-gain switch comprises:

a first transistor having an emitter connected to the output of the current generator and a collector connected to the second input of the current mirror driver;

a first resistor connected between the collector and a base of the first transistor; and a second resistor connected between a second voltage supply and the base of the first transistor.

15. The power amplifier circuit of claim 14, further comprising a third transistor having an emitter connected to ground, a base connected to the output of the current mirror driver and configured to receive the second current, and a collector connected to an output match element (OMN).

16. The power amplifier circuit of claim 14, wherein the current generator further comprises a second input connected to the second voltage supply, wherein the first current has a variation of current less than 0.2% as the second voltage supply has a variation of voltage about 2.8V.

17. The power amplifier circuit of claim 16, wherein the first current is about 0 mA as the second voltage supply is less than 2.4V.

18. The power amplifier circuit of claim 14, wherein the current generator include only one kind of transistors, and wherein the transistors are heterojunction bipolar transistors (HBT).

* * * * *